United States Patent
Sasaki et al.

(10) Patent No.: US 10,971,293 B2
(45) Date of Patent: Apr. 6, 2021

(54) SPIN-ORBIT-TORQUE MAGNETIZATION ROTATIONAL ELEMENT, SPIN-ORBIT-TORQUE MAGNETORESISTANCE EFFECT ELEMENT, AND SPIN-ORBIT-TORQUE MAGNETIZATION ROTATIONAL ELEMENT MANUFACTURING METHOD

(71) Applicant: TDK CORPORATION, Tokyo (JP)

(72) Inventors: Tomoyuki Sasaki, Tokyo (JP); Yohei Shiokawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 36 days.

(21) Appl. No.: 16/222,037

(22) Filed: Dec. 17, 2018

(65) Prior Publication Data
US 2019/0206602 A1 Jul. 4, 2019

(30) Foreign Application Priority Data

Dec. 28, 2017 (JP) .............................. JP2017-252907
Oct. 30, 2018 (JP) .............................. JP2018-204508

(51) Int. Cl.
*H01L 43/12* (2006.01)
*H01L 43/08* (2006.01)
(Continued)

(52) U.S. Cl.
CPC ......... *H01F 10/329* (2013.01); *G01R 33/093* (2013.01); *G01R 33/098* (2013.01);
(Continued)

(58) Field of Classification Search
CPC ......... H01L 43/08; H01L 43/10; H01L 43/12; H01L 43/04; H01L 43/06; G11C 11/161;
(Continued)

(56) References Cited

U.S. PATENT DOCUMENTS

| 8,350,347 B2 | 1/2013 | Gaudin et al. |
| 2006/0056223 A1 | 3/2006 | Ditewig et al. |

(Continued)

FOREIGN PATENT DOCUMENTS

| JP | 2005-526351 A | 9/2005 |
| JP | 2014-045196 A | 3/2014 |

(Continued)

OTHER PUBLICATIONS

Zhang et al; "Spin Hall Effects in Metallic Antiferromagnets;" Physical Review Letters; vol. 113; pp. 196602-1-196602-6; Nov. 7, 2014.

(Continued)

*Primary Examiner* — Michael M Trinh
(74) *Attorney, Agent, or Firm* — Oliff PLC

(57) ABSTRACT

A spin-orbit-torque magnetization rotational element includes: a spin-orbit torque wiring layer which extends in an X direction; and a first ferromagnetic layer which is laminated on the spin-orbit torque wiring layer, wherein the first ferromagnetic layer has shape anisotropy and has a major axis in a Y direction orthogonal to the X direction on a plane in which the spin-orbit torque wiring layer extends, and wherein the easy axis of magnetization of the first ferromagnetic layer is inclined with respect to the X direction and the Y direction orthogonal to the X direction on a plane in which the spin-orbit torque wiring layer extends.

20 Claims, 6 Drawing Sheets

(51) Int. Cl.
  *H01L 43/10* (2006.01)
  *H01F 10/32* (2006.01)
  *G01R 33/09* (2006.01)
  *H01L 43/04* (2006.01)
  *H01L 43/14* (2006.01)
  *H01L 43/06* (2006.01)
  *G11C 11/16* (2006.01)

(52) U.S. Cl.
  CPC .............. *G11C 11/161* (2013.01); *H01L 43/04* (2013.01); *H01L 43/06* (2013.01); *H01L 43/08* (2013.01); *H01L 43/10* (2013.01); *H01L 43/12* (2013.01); *H01L 43/14* (2013.01)

(58) Field of Classification Search
  CPC .... G01R 33/09; G01R 33/093; G01R 33/098; H01F 10/329
  See application file for complete search history.

(56) References Cited

U.S. PATENT DOCUMENTS

| | | | |
|---|---|---|---|
| 2011/0129691 | A1 | 6/2011 | Ishiwata et al. |
| 2014/0056060 | A1 | 2/2014 | Khvalkovskiy et al. |
| 2015/0036415 | A1 | 2/2015 | Di Pendina et al. |
| 2015/0348606 | A1 | 12/2015 | Buhrman et al. |
| 2016/0020207 | A1 | 1/2016 | Tsuchiya et al. |
| 2016/0164108 | A1* | 6/2016 | Matsuno ............ H01M 4/9025 429/465 |
| 2017/0222135 | A1 | 8/2017 | Fukami et al. |
| 2018/0019388 | A1* | 1/2018 | Fukami ................. G06N 3/088 |
| 2018/0114898 | A1* | 4/2018 | Lee ..................... G11C 11/1675 |
| 2018/0190899 | A1* | 7/2018 | Kim .................... G11C 11/1659 |
| 2019/0051820 | A1 | 2/2019 | Sugiyama et al. |
| 2019/0189516 | A1 | 6/2019 | Sasaki et al. |

FOREIGN PATENT DOCUMENTS

| | | |
|---|---|---|
| JP | 5441005 B2 | 3/2014 |
| JP | 2016-021530 A | 2/2016 |
| JP | 2017-216286 A | 12/2017 |
| JP | 2019-033166 A | 2/2019 |
| JP | 5620915 B1 | 12/2019 |
| WO | 2016/021468 A1 | 2/2016 |
| WO | 2016/159017 A1 | 10/2016 |
| WO | 2018/189964 A1 | 10/2018 |
| WO | 2019/171715 A1 | 9/2019 |

OTHER PUBLICATIONS

Seo et al; "Area-Efficient SOT-MRAM With a Schottky Diode;" IEEE Electron Device Letters; vol. 37; No. 8; pp. 982-985; Aug. 2016.
Takahashi et al; "Spin injection and detection in magnetic nanostructures;" Physical Review B; vol. 67; Feb. 28, 2003.
Fukami et al; "Magnetization switching by spin-orbit torque in an antiferromagnet-ferromagnet bilayer system;" Nature Materials; vol. 15; Feb. 15, 2016.
Lee et al; "Thermally activated switching of perpendicular magnet by spin-orbit spin torque;" Applied Physics Letters; vol. 104; pp. 072413-1-074213-5; Feb. 21, 2014.
Lee et al; "Threshold current for switching of a perpendicular magnetic layer induced by spin Hall effect;" Applied Physics Letters; vol. 102; Mar. 25, 2013.
Liu et al; "Current-Induced Switching of Perpendicularly Magnetized Magnetic Layers Using Spin Torque from the Spin Hall Effect;" Physical Review Letters; vol. 109; pp. 096602-1-096602-5; Aug. 31, 2012.
Liu et al; "Spin torque switching with the giant spin Hall effect of tantalum;" Mar. 13, 2012.
Miron et al; "Perpendicular switching of a single ferromagnetic layer induced by in-plane current injection;" Nature; vol. 476; pp. 189-193; Aug. 11, 2011.
Kato et al; "Observation of the Spin Hall Effect in Semiconductors;" Science; vol. 306; pp. 1910-1913; Dec. 10, 2004.
Fukami et al; "A spin-orbit torque switching scheme with collinear magnetic easy axis and current configuration;" Nature Nanotechnology; Mar. 21, 2016.
Sato et al. "Perpendicular-anisotropy CoFeB-MgO magnetic tunnel junctions with a MgO/CoFeBITa/CoFeB/MgO ecording structure." Applied Physics Letters, 101, 022414, 2012, pp. 1-4.
Liu et al. "Magnetic Oscillations Driven by the Spin Hall Effect in 3-Terminal Magnetic Tunnel Junction Devices." Physical Review Letters, 109, 186602, 2012, pp. 1-5.
Kimura et al. "Electrical Control of the Direction of Spin Accumulation." Physical Review Letters, 99, 166601, 2007, pp. 1-4.
Yu et al. "Switching of perpendicular magnetization by spin-orbit torques in the absence of external magnetic fields." Nature nanotechnology, vol. 9, 2014, pp. 548-554.

* cited by examiner

SPIN-ORBIT-TORQUE MAGNETIZATION ROTATIONAL ELEMENT, SPIN-ORBIT-TORQUE MAGNETORESISTANCE EFFECT ELEMENT, AND SPIN-ORBIT-TORQUE MAGNETIZATION ROTATIONAL ELEMENT MANUFACTURING METHOD

TECHNICAL FIELD

The present disclosure relates to a spin-orbit-torque magnetization rotational element, a spin-orbit-torque magnetoresistance effect element, and a spin-orbit-torque magnetization rotational element manufacturing method.

Priority is claimed on Japanese Patent Application No. 2017-252907, filed on Dec. 28, 2017, and Japanese Patent Application No. 2018-204508, filed on Oct. 30, 2018 the contents of which is incorporated herein by reference.

BACKGROUND ART

In a tunneling magnetoresistance (TMR) device using an insulating layer (a tunnel barrier layer or a barrier layer) for a nonmagnetic layer, a method in which writing (magnetization rotation) is performed by using a magnetic field generated by a current and a method in which writing (magnetization rotation) is performed by using a spin transfer torque (STT) generated by a current flowing in a laminating direction of a magnetoresistance effect element are known. Although the magnetization rotation of a TMR element using an STT is efficient from the viewpoint of energy efficiency, the TMR element may be deteriorated since a current is applied in the lamination direction of the magnetoresistance effect element in order to cause the magnetization rotation.

Therefore, in recent years, a spin-orbit-torque magnetization rotational element using a pure spin current generated by a spin-orbit interaction has gained attention as means for generating magnetization rotation without allowing a current to flow in the lamination direction of the magnetoresistance effect element. When a current flows to the spin-orbit torque wiring layer, a pure spin current is generated by a spin-orbit interaction or a Rashba effect at the interface of dissimilar materials. The pure spin current causes a spin-orbit torque (SOT) and magnetization rotation of a ferromagnetic material disposed on a spin-orbit torque wiring is generated due to the SOT. The pure spin current is generated by the same number of electrons with an upward spin and a downward spin flowing in mutually opposite directions and the flows of electric charge cancel each other out. For that reason, a rotational current flowing in the magnetoresistance effect element is zero and hence longer durability of the magnetoresistance effect element can be expected. The spin-orbit-torque magnetization rotational element can easily perform magnetization rotation since the density of the current flowing in the spin-orbit torque wiring is high.

Spin-orbit-torque magnetization rotational elements are classified into several types in accordance with a relationship between the direction of the current flowing in the spin-orbit torque wiring and the easy axis of magnetization direction of the ferromagnetic material. A spin-orbit-torque magnetization rotational element includes a spin-orbit torque wiring layer which extends in the X direction and a first ferromagnetic layer which is laminated on one surface thereof. Magnetized rotational elements are classified as X type, Y type, and Z type, according to the easy axis of magnetization direction of the first ferromagnetic layer, an X type magnetization rotational element has an easy axis of magnetization in the X direction similarly to the spin-orbit torque wiring layer, a Y type magnetization rotational element has an easy axis of magnetization in the Y direction orthogonal to the X direction in an in-plane direction. A Z type magnetization rotational element has an easy axis of magnetization in the Z direction (the lamination direction) orthogonal to the in-plane direction. Since a short time is necessary for magnetization rotation therein, X type and Z type magnetization rotational elements can operate at high speed. Further, since an X type magnetization rotational element is disposed so that the spin-orbit torque wiring layer has a major axis in the X direction, a width in the Y direction can be narrowed. For that reason, an X type magnetization rotational element can perform magnetization inversion with a smaller current than that of a Y type magnetization rotational element. However, external magnetic fields in the Z direction and the X direction need to be applied to X type and Z type magnetization rotational elements in order to assist magnetization rotation. For that reason, X type and Z type magnetization rotational elements have a problem regarding energy consumption and integration. Meanwhile, an Y type magnetization rotational element does not need an external magnetic field for assisting magnetization rotation, but has a problem that the time necessary for the magnetization rotation is high.

In order to solve this problem, an XY-type magnetization rotational element of which the easy axis of magnetization of a first ferromagnetic layer is inclined with respect to both the X direction and the Y direction has been proposed (S. Fukami, et al., Nature Nanotechnology, DOI: 10.1038/NNANO. 2016.29 Supplement). FIG. 11 shows an XY-type magnetization rotational element 501. The XY-type magnetization rotational element 501 includes a spin-orbit torque wiring layer 502, a first ferromagnetic layer 504, and an electrode 506. The first ferromagnetic layer 504 and the electrode 506 are laminated on one surface of the spin-orbit torque wiring layer 502 and the electrode 506 sandwiches the first ferromagnetic layer 504 in a plan view. Further, the first ferromagnetic layer 504 has a major axis which is inclined with respect to the X direction and the Y direction in a plan view different from the spin-orbit torque wiring layer 502 having a major axis in the X direction. The easy axis of magnetization 508 of the first ferromagnetic layer 504 is oriented in a direction parallel to the major axis of the first ferromagnetic layer 504 due to shape anisotropy.

In the XY-type magnetization rotational element 501 with such a configuration, since the easy axis of magnetization has a Y direction element, magnetization rotation is caused even when no external magnetic field is applied. Further, since the easy axis of magnetization has an X direction element, the time necessary for the magnetization rotation is short as compared with a Y type magnetization rotational element and hence an XY-type magnetization rotational element is suitable for high-speed operation.

SUMMARY OF INVENTION

Technical Problem

However, in the XY-type magnetization rotational element shown in FIG. 11, since the major axis of the first ferromagnetic layer is inclined with respect to the X direction and the Y direction, the width of the first ferromagnetic layer 504 in the X direction is high. A spin is injected from the spin-orbit torque wiring layer 502 to the first ferromagnetic layer 504. The spin injection amount is not stable when a current is disturbed at a position overlapping the first ferromagnetic layer 504 in a plan view of the spin-orbit torque wiring layer 502. For this reason, it is desirable to secure a certain distance between the electrode 506 and the first ferromagnetic layer 504. When a sufficient distance is secured therebetween, the XY-type magnetization rotational element 501 needs to have a certain size in the X direction and the XY-type magnetization rotational element 501 has poor integration when a plurality of elements are integrated.

The present disclosure has been made in view of the above-described problems and an object of the present disclosure is to provide a spin-orbit-torque magnetization rotational element, a spin-orbit-torque magnetoresistance effect element, and a spin-orbit-torque magnetization rotational element manufacturing method capable of causing magnetization rotation while not applying an external magnetic field without increasing a current flowing in a spin-orbit torque wiring layer, and having excellent integration.

Solution to Problem

The present inventors have found that magnetization rotation can be easily performed while not applying an external magnetic field without increasing a current flowing in a spin-orbit torque wiring layer since a Y direction element of magnetization increases simply by inclining an easy axis of magnetization of a first ferromagnetic layer from a major axis of the spin-orbit torque wiring layer while aligning the major axis of the first ferromagnetic layer to a minor axis of the spin-orbit torque wiring layer. Further, the inventors have found that a space necessary in the X direction can be decreased and integration when integrating a plurality of elements can be improved when the major axis of the first ferromagnetic layer is aligned to the short axis of the spin-orbit torque wiring layer. That is, the present disclosure provides the following means in order to solve the above-described problems.

(1) A spin-orbit-torque magnetization rotational element according to a first aspect includes: a spin-orbit torque wiring layer which extends in an X direction; and a first ferromagnetic layer which is laminated on the spin-orbit torque wiring layer, wherein the first ferromagnetic layer has shape anisotropy and has a major axis in a Y direction orthogonal to the X direction on a plane in which the spin-orbit torque wiring layer extends, and wherein the easy axis of magnetization of the first ferromagnetic layer is inclined with respect to the X direction and the Y direction orthogonal to the X direction on a plane in which the spin-orbit torque wiring layer extends.

(2) In the spin-orbit-torque magnetization rotational element according to the above-described aspect, the first ferromagnetic layer may be an HoCo alloy, an SmFe alloy, an FePt alloy, a CoPt alloy, or a CoCrPt alloy.

(3) A spin-orbit-torque magnetoresistance effect element according to a second aspect includes: the spin-orbit-torque magnetization rotational element according to the above-described aspect; a second ferromagnetic layer which is disposed on a side of the first ferromagnetic layer opposite to a side with the spin-orbit torque wiring layer, a magnetization direction of the second ferromagnetic layer being fixed; and a nonmagnetic layer which is disposed between the first ferromagnetic layer, and the second ferromagnetic layer.

(4) The spin-orbit-torque magnetoresistance effect element according to the above-described aspect may further include a diffusion prevention layer which is disposed between the first ferromagnetic layer, and the nonmagnetic layer.

(5) In the spin-orbit-torque magnetoresistance effect element according to the above-described aspect, the diffusion prevention layer may include nonmagnetic heavy metal.

(6) In the spin-orbit-torque magnetoresistance effect element according to the above-described aspect, the diffusion prevention layer may have a thickness of twice or less an ionic radius of an element constituting the diffusion prevention layer.

(7) The spin-orbit-torque magnetoresistance effect element according to the above-described aspect may further include a third ferromagnetic layer which is disposed between the nonmagnetic layer, and the diffusion prevention layer.

(8) A spin-orbit-torque magnetization rotational element manufacturing method according to a third aspect is a method of manufacturing the spin-orbit-torque magnetization rotational element according to the above-described aspect including the step of forming at least a first ferromagnetic layer while applying a magnetic field thereto in directions including the X direction.

(9) The manufacturing method according to the above-described aspect may further include the step of annealing the first ferromagnetic layer while applying a magnetic field in a direction including the X direction after forming at least the first ferromagnetic layer.

(10) A spin-orbit-torque magnetization rotational element manufacturing method according to a fourth aspect is a method of manufacturing the spin-orbit-torque magnetization rotational element according to the above-described aspect including the step of annealing a first ferromagnetic layer while applying a magnetic field thereto in directions including the X direction after forming at least the first ferromagnetic layer.

Advantageous Effects of Invention

According to the spin-orbit-torque magnetization rotational element of the above-described aspect, it is possible to cause magnetization rotation while not applying an external magnetic field without increasing a current flowing in a spin-orbit torque wiring layer, and to obtain excellent integration.

DESCRIPTION OF EMBODIMENTS

Figure 1:
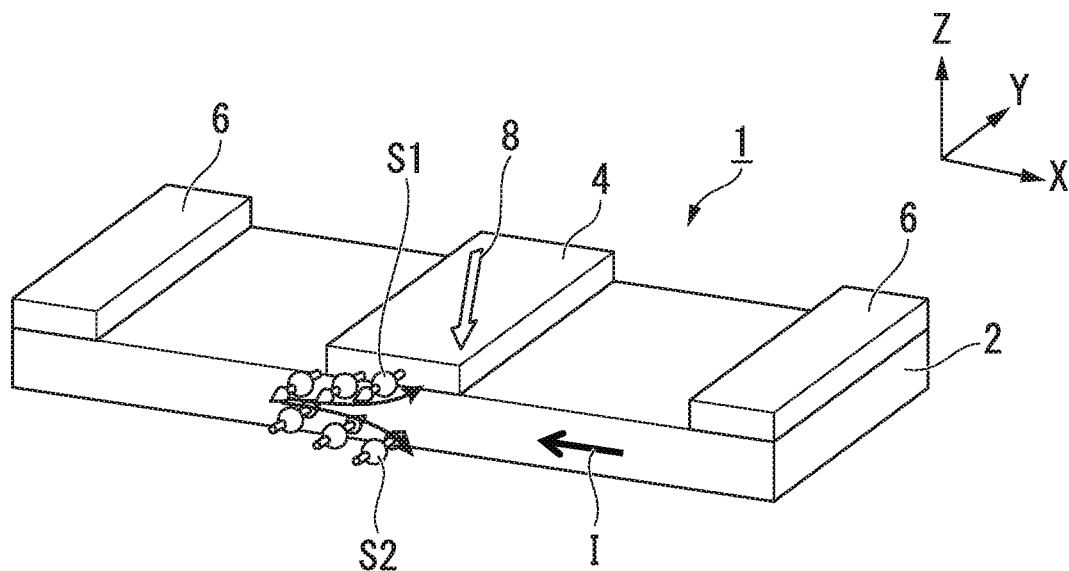
FIG. 1 is a perspective view schematically showing a spin-orbit-torque magnetization rotational element according to an embodiment of the present disclosure.

Hereinafter, the present disclosure will be described in detail by appropriately referring to the drawings. In the drawings used in the following description, for the sake of easy understanding of the features of the present disclosure, there are cases in which the characteristic portions are enlarged and the dimensional proportions of the constituents are different from actual ones. Materials, sizes, and the like exemplified in the following description are mere examples and the present disclosure is not limited thereto and can be appropriately modified within the range that achieves the effects of the present disclosure.

(Spin-Orbit-Torque Magnetization Rotational Element)

Figure 2:
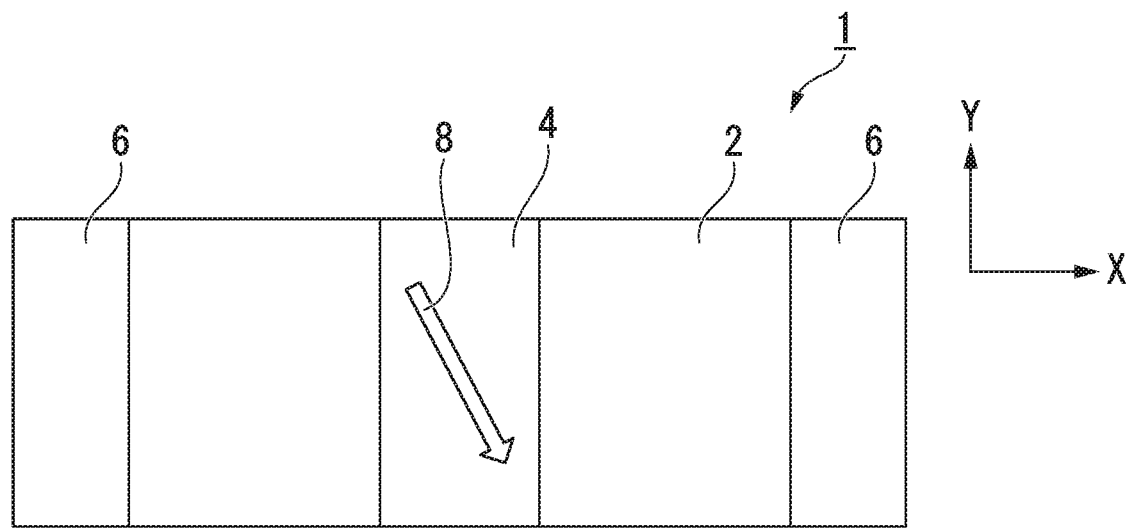
FIG. 2 is a plan view schematically showing the spin-orbit-torque magnetization rotational element shown in FIG. 1.

FIG. 1 is a perspective view schematically showing a spin-orbit-torque magnetization rotational element 1 according to an embodiment of the present disclosure. FIG. 2 is a plan view schematically showing the spin-orbit-torque magnetization rotational element 1 of FIG. 1. The spin-orbit-torque magnetization rotational element 1 according to the embodiment of the present disclosure includes a spin-orbit torque wiring layer 2, a first ferromagnetic layer 4 which is laminated on the spin-orbit torque wiring layer 2, and electrodes 6 which are laminated on the spin-orbit torque wiring layer 2 with the first ferromagnetic layer 4 interposed therebetween. Hereinafter, a direction in which a major axis of the spin-orbit torque wiring layer 2 extends is defined as the X direction, a direction which is orthogonal to the X direction within a plane in which the spin-orbit torque wiring layer 2 extends is defined as the Y direction, and a direction which is orthogonal to both the X direction and the Y direction is defined as the Z direction. In FIG. 1, the lamination direction of the first ferromagnetic layer 4 is the Z direction. The major axis of the first ferromagnetic layer 4 has a shape anisotropy extending in the Y direction. Further, the first ferromagnetic layer 4 has a magnetization 8 formed along the easy axis of magnetization which is inclined with respect to the X direction and the Y direction.

<Spin-Orbit Torque Wiring>

The spin-orbit torque wiring layer 2 extends in the X direction. The spin-orbit torque wiring layer 2 is connected to one surface of the first ferromagnetic layer 4 in the Z direction. The spin-orbit torque wiring layer 2 may be directly connected to the first ferromagnetic layer 4 or may be connected thereto through another layer.

A layer interposed between the spin-orbit torque wiring layer 2 and the first ferromagnetic layer 4 preferably does not dissipate the spin propagating from the spin-orbit torque wiring layer 2. For example, it is known that silver, copper, magnesium, aluminum, and the like have a long spin diffusion length of 100 nm or more and it is difficult for spin to dissipate therewith.

Further, the thickness of this layer is preferably equal to or smaller than the spin diffusion length of the substance forming the layer. When the thickness of the layer is equal to or smaller than the spin diffusion length, sufficient spin propagating from the spin-orbit torque wiring layer 2 can be transmitted to the first ferromagnetic layer 4.

The spin-orbit torque wiring layer 2 is formed of a material which generates a spin current due to a spin Hall effect when a current flows thereto. As such a material, a material that generates a spin current in the spin-orbit torque wiring layer 2 is sufficient. Thus, the material is not limited to a material consisting of a single element and may consist of a part formed of a material generating a spin current and a part formed of a material not generating a spin current.

A phenomenon in which a first spin S1 and a second spin S2 are bent in opposite directions in a direction orthogonal to a current direction on the basis of a spin-orbit interaction when a current flows to the material and a spin current is generated is called a spin Hall effect. The general Hall effect and the spin Hall effect are the same in that moving electric charge (electrons) is bent in the motion (movement) direction, but are greatly different as follows. In the general Hall effect, charged particles moving in a magnetic field are subjected to a Lorentz force and the motion direction is bent. Further, in the spin Hall effect, only electrons move (only a current flows) to bend the movement direction even when there is no magnetic field.

In a nonmagnetic material (a material which is not a ferromagnetic material), since the number of electrons with the first spin S1 is the same as the number of electrons with the second spin S2, the number of electrons with the first spin S1 moving toward a surface on which a first ferromagnetic layer 8 of the spin-orbit torque wiring layer 2 is disposed is the same as the number of electrons with the second spin S2 moving in the opposite direction along with the electrons with the first spin S1 in the drawings. For that reason, the current as a net flow of charge is zero. This currentless spin current is particularly called a pure spin current.

Here, when the flow of electrons with the first spin S1 is indicated by $J\uparrow$, the flow of electrons with the second spin S2 is indicated by $J\downarrow$, and the spin current is indicated by $J_S$, $J_S = J\uparrow - J\downarrow$, is defined. In FIG. 1, $J_S$ which is the pure spin current flows upward in the drawings. Here, $J_S$ is a flow of electrons with a polarizability of 100%.

The spin-orbit torque wiring layer 2 may include a nonmagnetic heavy metal. Here, a heavy metal is used with the meaning of a metal having a specific gravity greater than or equal to that of yttrium. The spin-orbit torque wiring layer 2 may consist of only a nonmagnetic heavy metal.

In this case, the nonmagnetic heavy metal is preferably a nonmagnetic metal having a large atomic number of 39 or more and having d or f electrons in the outermost shell. This is because such a nonmagnetic metal will have a large spin-orbit interaction causing a spin Hall effect. The spin-orbit torque wiring layer 2 may consist of only nonmagnetic metals having an atomic number of 39 or more and having a large number of d or f electrons in the outermost shell.

In general, when a current flows to a metal, all electrons move in a direction opposite to the current regardless of the direction of the spin. However, since a non-magnetic metal having a large number of d or f electrons in the outermost shell has a large spin-orbit interaction, the movement direction of electrons depends on the spin direction of electrons due to the spin Hall effect and the pure spin current $J_S$ is likely to occur.

Further, the spin-orbit torque wiring layer 2 may include a magnetic metal. A magnetic metal indicates a ferromagnetic metal or an antiferromagnetic metal. When a small amount of a magnetic metal is included with a nonmagnetic metal, the spin-orbit interaction is increased and the spin current generation efficiency for the current flowing in the spin-orbit torque wiring layer 2 is improved. The spin-orbit torque wiring layer 2 may consist of only antiferromagnetic metals.

Since a spin-orbit interaction is caused by the inherent internal field of a spin-orbit torque wiring material substance, a pure spin current occurs also in a nonmagnetic material. When a small amount of a magnetic metal is added to a spin-orbit torque wiring substance, the magnetic metal itself scatters the electron spins flowing therein so that the spin current generation efficiency is improved. However, when an amount of a magnetic metal added is increased too much, the generated spin current is scattered by the added magnetic metal and hence a spin current reduction action becomes strong. Thus, the molar ratio of the added magnetic metal is preferably sufficiently smaller than the molar ratio of the main element of the spin generation part of the spin-orbit torque wiring. As a standard, the molar ratio of the added magnetic metal is preferably 3% or less.

Further, the spin-orbit torque wiring layer 2 may include a topological insulator. The spin-orbit torque wiring layer 2 may consist only of a topological insulator. A topological insulator is a substance in which the inside of the substance is an insulator or a high resistance material, but a spin-polarized metallic state is generated on the surface. There is a substance having an internal magnetic field called a spin-orbit interaction. Thereby, a new topological phase appears due to the effect of the spin-orbit interaction even when there is no external magnetic field. This is a topological insulator and can generate a pure spin current with high efficiency due to the strong spin-orbit interaction and the inverse symmetry breaking at the edge.

As a topological insulator, for example, SnTe, $Bi_{1.5}Sb_{0.5}Te_{1.7}Se_{1.3}$, $TlBiSe_2$, $Bi_2Te_3$, $Bi_{1-x}Sb_x$, $(Bi_{1-x}Sb_x)_2Te_3$, and the like are preferable. These topological insulators are capable of generating a spin current with high efficiency.

<First Ferromagnetic Layer>

The first ferromagnetic layer 4 is laminated on the spin-orbit torque wiring layer 2 in the Z direction orthogonal to the X direction. The first ferromagnetic layer 4 has shape anisotropy in which the major axis extends in the Y direction orthogonal to the X direction. Further, the first ferromagnetic layer 4 includes the magnetization 8 having an easy axis of magnetization in a direction inclined with respect to the X direction and the Y direction on a plane in which the spin-orbit torque wiring layer 2 extends. The first ferromagnetic layer 4 preferably includes, for example, an HoCo alloy, an SmFe alloy, an FePt alloy, a CoPt alloy, and a CoCrPt alloy. As the material of the first ferromagnetic layer 4, a tetragonal magnetic material of which a c-axis length is shorter than an a-axis length is preferable. When the c-axis length is shorter than the a-axis length, the easy axis of magnetization of the first ferromagnetic layer 4 is easily oriented in the in-plane direction. For example, a SmFe alloy ($SmFe_{12}$) or the like is preferable. Further, when the c-axis length is longer than the a-axis length, the easy axis of magnetization of the first ferromagnetic layer 4 is easily oriented in a direction perpendicular to the plane. However, when a film is formed or annealed in the magnetic field, the c axis can be oriented in the in-plane magnetic field direction. For example, a HoCo alloy ($HoCo_2$) or the like is preferable. Since these alloys have strong magnetocrystalline anisotropy and large damping constants, magnetization rotation hardly occurs. Thus, the first ferromagnetic layer 4 formed using these materials has excellent data storage ability.

The major axis direction of the first ferromagnetic layer 4 is different from the easy axis of magnetization direction of the first ferromagnetic layer 4. In this case, the easy axis of magnetization direction of the magnetization 114 of the first ferromagnetic layer 4 can be obtained by, for example, the following methods.

The first method is to dispose a plurality of first ferromagnetic layers 4 manufactured under the same conditions and measure their magnetic characteristics. Magnetic characteristics can be measured by a vibrating sample type magnetometer (VSM), a superconducting quantum interferometer (SQUID), a physical property measuring device (PPMS), or the like.

First, a plurality of first ferromagnetic layers 4 of which major axes are aligned in one direction are arranged in, for example, an array. Then, a constant magnetic field is applied to the element aggregate of the first ferromagnetic layers 4 from a predetermined direction (reference direction) in the xy plane and magnetization in a predetermined direction of the first ferromagnetic layer 4 is measured. Since the plurality of first ferromagnetic layers 4 are aggregated, the element aggregate shows measurable magnetization. This operation is performed by measuring at a plurality of points around the element aggregate in the in-plane direction while changing an angle at which the magnetic field is applied.

When plotting the magnitude of magnetization in a predetermined direction on the vertical axis and the tilt angle from the reference direction of the magnetic field applied to the element aggregate on the horizontal axis, the magnetization characteristics of the element aggregate are obtained. When the first ferromagnetic layer 4 has an isotropic shape in the xy plane (for example, a circle in a plan view), the measured magnetization characteristics describe a sine curve. Further, when the first ferromagnetic layer 4 has a major axis in one direction and the easy axis of magnetization direction of the first ferromagnetic layer 4 corresponds to the major axis direction of the first ferromagnetic layer 4, the shape of the sine curve (the tilt angle at each point of the graph) changes, but the tilt angle indicating the maximum magnetization is the same as in the case of an isotropic shape. In contrast, when the first ferromagnetic layer 4 has a major axis in one direction and the easy axis of magnetization direction of the first ferromagnetic layer 4 is different from the major axis direction of the first ferromagnetic layer 4, the shape of the sine curve (the tilt angle of each point of the graph) changes and the tilt angle indicating the maximum magnetization is shifted. That is, when the tilt angle with respect to the reference direction at a position indicating a peak of magnetization in the graph is different from the tilt angle with respect to the reference direction of the major axis direction of the first ferromagnetic layer 4, it can be ascertained that the major axis direction of the first ferromagnetic layer 4 is different from the easy axis of magnetization direction of the first ferromagnetic layer 4.

Further, the second method is to measure a resistance value of the spin-orbit-torque magnetization rotational element 1 while applying a magnetic field to the spin-orbit-torque magnetization rotational element 1. The resistance value of the spin-orbit-torque magnetization rotational element 1 is measured while changing the angle of the constant magnetic field from a predetermined direction (a reference direction) within the xy plane. The resistance value of the spin-orbit-torque magnetization rotational element 1 is a resistance value between the upper surface of the first ferromagnetic layer 4 and one end of the spin-orbit torque wiring layer 2 and is mainly a resistance value of the first ferromagnetic layer 4.

When plotting the resistance value of the spin-orbit-torque magnetization rotational element 1 as the vertical axis and the tilt angle from the reference direction of the magnetic field applied to the first ferromagnetic layer 4 as the horizontal axis, the resistance characteristics of the spin-orbit-torque magnetization rotational element 1 are obtained. The resistance characteristics have a behavior as in the above-described magnetization characteristics. When the first ferromagnetic layer 4 has an isotropic shape in the xy plane (for example, a circle in a plan view), the measured resistance characteristics draw a sine curve. Further, when the first ferromagnetic layer 4 has a major axis in one direction and the easy axis of magnetization direction of the first ferromagnetic layer 4 corresponds to the major axis direction of the first ferromagnetic layer 4, the shape of the sine curve (the tilt angle of each point of the graph) changes, but the tilt angle indicating the maximum resistance is the same as in the case of the isotropic shape. In contrast, when the first ferromagnetic layer 4 has a major axis in one direction and the easy axis of magnetization direction of the first ferromagnetic layer 4 is different from the major axis direction of the first ferromagnetic layer 4, the shape of the sine curve (the tilt angle of each point of the graph) changes and the tilt angle indicating the maximum magnetization is shifted. That is, when the tilt angle with respect to the reference direction at a position indicating a peak of the resistance of the graph is different from the tilt angle with respect to the reference direction of the major axis direction of the first ferromagnetic layer 4, it is known that the major axis direction of the first ferromagnetic layer 4 is different from the easy axis of magnetization direction of the first ferromagnetic layer 4.

<Principle of Spin-Orbit-Torque Magnetization Rotational Element>

Next, a principle of the spin-orbit-torque magnetization rotational element 1 will be described with reference to FIGS. 1 and 2.

As shown in FIG. 1, when a current I is applied to the spin-orbit torque wiring layer 2, the first spin S1 and the second spin S2 are bent by the spin Hall effect. As a result, the pure spin current $J_S$ is generated in the Z direction.

In FIG. 1, since the first ferromagnetic layer 4 is laminated on the spin-orbit torque wiring layer in the Z direction, the pure spin current flows into the first ferromagnetic layer 4 to be diffused thereinto. That is, a spin is injected into the first ferromagnetic layer 4. The injected spin applies a spin-orbit torque (SOT) to the magnetization 8 of the first ferromagnetic layer 4 so that magnetization rotation occurs. In FIGS. 1 and 2, the magnetization 8 of the first ferromagnetic layer 4 is schematically shown as one magnetization located at the center of the first ferromagnetic layer 4.

Figure 11:
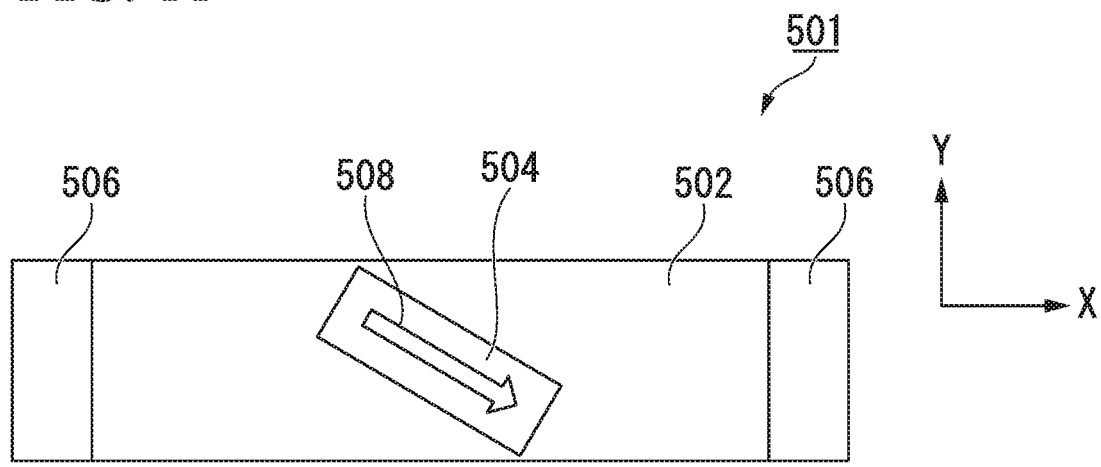
FIG. 11 is a plan view schematically showing a conventional spin-orbit-torque magnetization rotational element.

When the direction of the spin injected into the ferromagnetic layer is orthogonal to the magnetization direction, there is a need to disturb the symmetry of magnetization by applying an external magnetic field in order to cause magnetization rotation. However, in the spin-orbit-torque magnetization rotational element 1 shown in FIG. 1, the direction of the spin injected from the spin-orbit torque wiring layer 2 to the first ferromagnetic layer 4 is oriented in the Y direction and the direction of the magnetization 8 of the first ferromagnetic layer 4 is inclined with respect to both the X direction and the Y direction and has an X direction element and a Y direction element. Thus, since the magnetization 8 has a Y direction element which is not orthogonal to the direction of the spin, it is possible to realize magnetization rotation without applying an external magnetic field. When it is not necessary to apply an external magnetic field, it is possible to reduce energy consumption and to improve the degree of integration of elements. Further, since the magnetization 8 has an X direction element, the dependence of the magnetization rotation on the current density of the inversion current becomes smaller in the spin-orbit-torque magnetization rotational element 1 shown in FIG. 1 differently from a case in which the magnetization 8 extends in the Y direction. For that reason, since it is possible to reduce the time necessary for the magnetization rotation, this is suitable for a high-speed operation. Further, since the major axis of the first ferromagnetic layer 4 is disposed along the Y direction differently from the conventional XY-type magnetization rotational element shown in FIG. 11, it is possible to narrow the width of the first ferromagnetic layer 4 in the Y direction. A spin is injected from the spin-orbit torque wiring layer 2 into the first ferromagnetic layer 4. In order to stabilize the spin injection amount, it is necessary to stabilize a current at a position overlapping the first ferromagnetic layer 4 in a plan view of the spin-orbit torque wiring layer 2 and it is desirable to secure a distance between the electrode 6 and the first ferromagnetic layer 4 to a certain extent. That is, since the width of the first ferromagnetic layer 4 in the Y direction can be narrowed, it is possible to decrease the overall size of the spin-orbit-torque magnetization rotational element 1 in the X direction. Thus, it is possible to improve integration when integrating a plurality of spin-orbit-torque magnetization rotational elements 1.

In order to improve the stability of magnetization inversion of the magnetization 8, it is desirable that the Y direction element of the magnetization 8 be larger than the X direction element. On the other hand, in order to improve the response of the magnetization rotation of the magnetization 8, it is desirable that the X direction element of the magnetization 8 be larger than the Y direction element.

(Spin-Orbit-Torque Magnetization Rotational Element Manufacturing Method)

Figure 3:
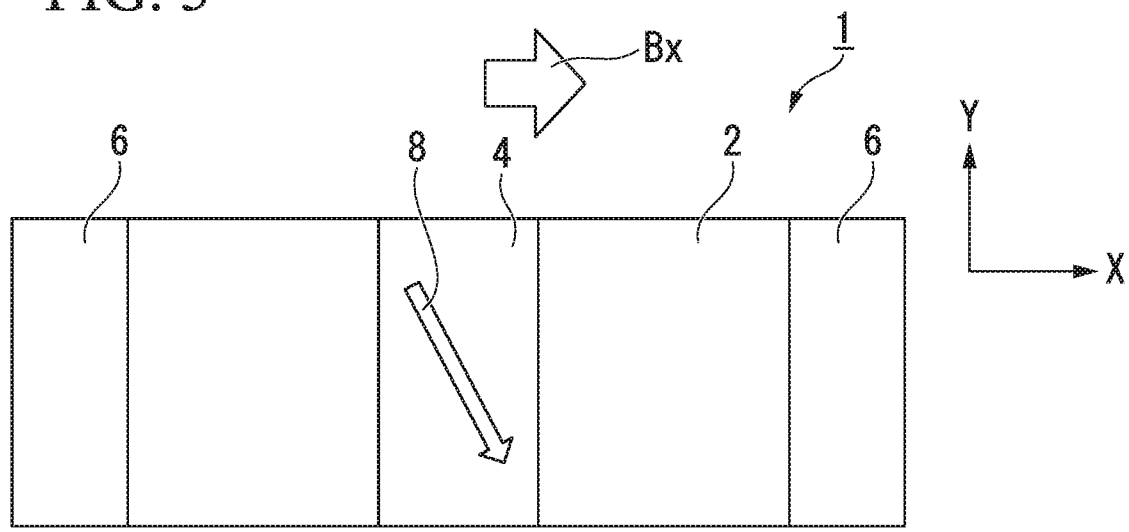
FIG. 3 is a plan view schematically showing a spin-orbit-torque magnetization rotational element manufacturing method according to the embodiment of the present disclosure.

FIG. 3 is a plan view schematically showing a spin-orbit-torque magnetization rotational element manufacturing method according to the embodiment of the present disclosure. First, the spin-orbit torque wiring layer 2 is manufactured on a substrate which is a support body. The spin-orbit torque wiring layer 2 can be manufactured by using a known film forming method such as sputtering.

Next, the first ferromagnetic layer 4 is manufactured. The first ferromagnetic layer 1 can be manufactured by using a known film forming method such as sputtering. However, when the first ferromagnetic layer 4 is formed simply to have a shape having a major axis in the Y direction, the easy axis of magnetization also extends in the Y direction due to the shape anisotropy and hence the XY-type magnetization rotational element cannot be realized. Therefore, as shown in FIG. 3, the first ferromagnetic layer 4 is formed while applying a magnetic field $B_x$ having an X direction element from the outside. Then, the easy axis of magnetization of the first ferromagnetic layer 4 is also inclined with respect to both the X direction and the Y direction by the action of the shape anisotropy and the magnetic field $B_x$.

Further, it is possible to obtain an easy axis of magnetization which is inclined with respect to both the X direction and the Y direction even when the first ferromagnetic layer 4 is annealed at a predetermined temperature, for example, 250° C. to 400° C. while applying the magnetic field $B_x$ having an X direction element after forming the first ferromagnetic layer 4 without applying the magnetic field $B_x$ at the time of forming the first ferromagnetic layer 4. Further, the first ferromagnetic layer 4 may be annealed at a predetermined temperature, for example, 250° C. to 400° C. while further applying the magnetic field $B_x$ having an X direction element after the first ferromagnetic layer 4 is formed while applying the magnetic field $B_x$ having an X direction element at the time of forming the first ferromagnetic layer 4.

(Spin-Orbit-Torque Magnetoresistance Effect Element According to First Embodiment)

Figure 4:
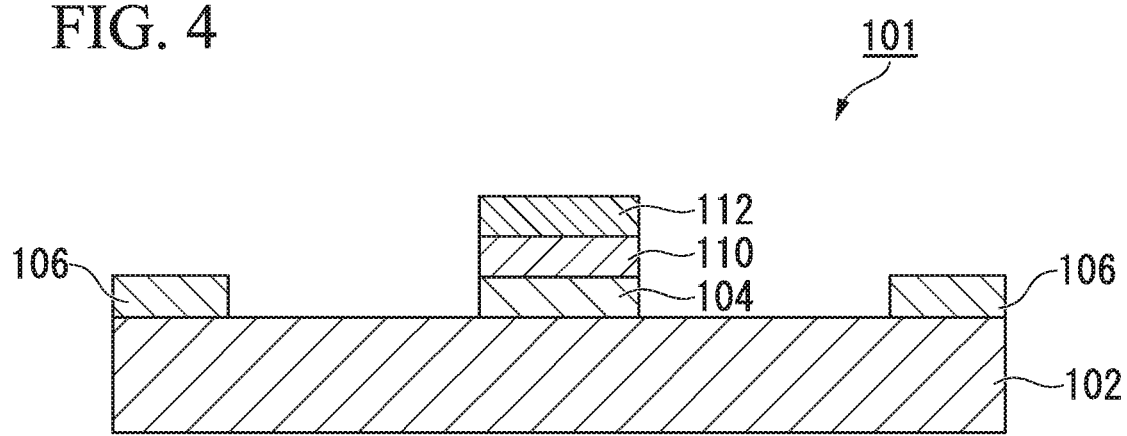
FIG. 4 is a cross-sectional view schematically showing a spin-orbit-torque magnetoresistance effect element according to the embodiment of the present disclosure.
Figure 5:
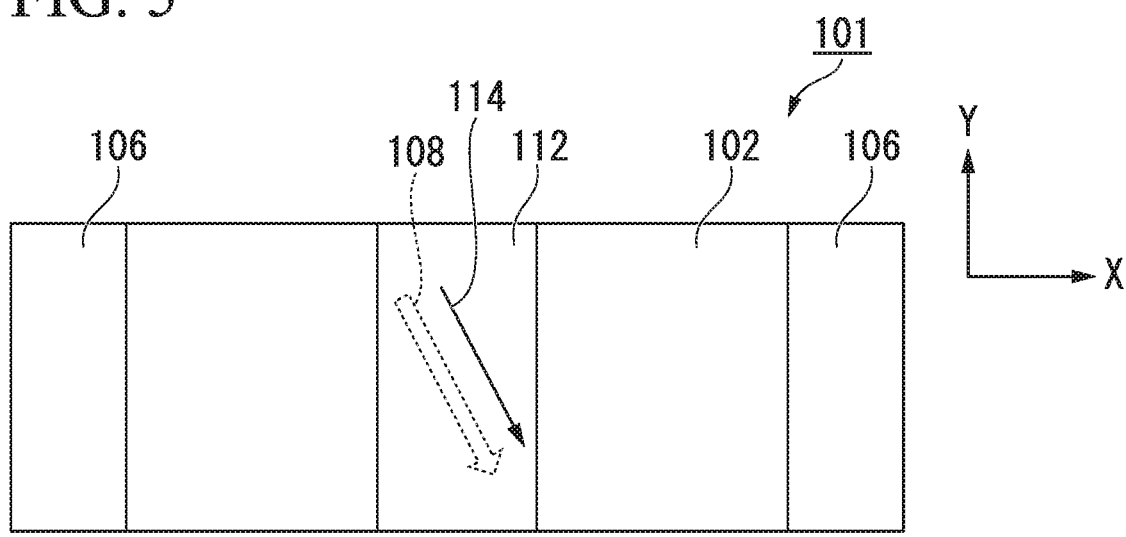
FIG. 5 is a plan view schematically showing the spin-orbit-torque magnetoresistance effect element shown in FIG. 4.
Figure 6:
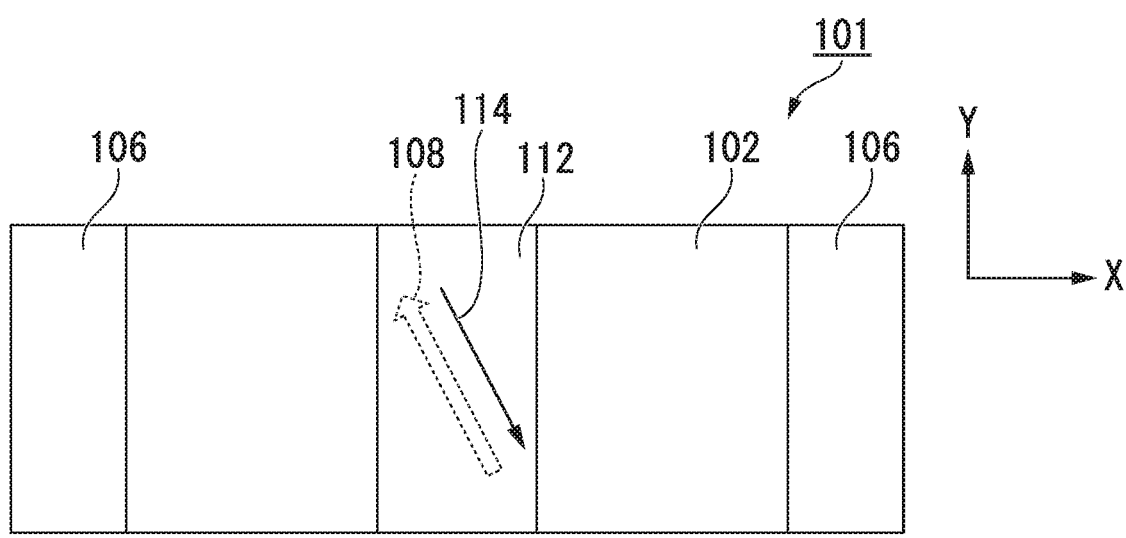
FIG. 6 is a plan view schematically showing the spin-orbit-torque magnetoresistance effect element of FIG. 4 in a state in which magnetization is inverted.

FIG. 4 is a cross-sectional view schematically showing a spin-orbit-torque magnetoresistance effect element 101 according to a first embodiment of the present disclosure and FIG. 5 is a plan view schematically showing the spin-orbit-torque magnetoresistance effect element 101 of FIG. 4. FIG. 6 is a plan view schematically showing the spin-orbit-torque magnetoresistance effect element 101 of FIG. 4 in a state in which the magnetization is inverted.

The spin-orbit-torque magnetoresistance effect element 101 includes a spin-orbit-torque magnetization rotational element which includes a spin-orbit torque wiring layer 102 having a major axis extending in the X direction and a first ferromagnetic layer 104 laminated on the spin-orbit torque wiring layer 102 in the Z direction perpendicular to the X direction, a second ferromagnetic layer 112 which is disposed at the opposite side to the spin-orbit torque wiring layer 102 in the first ferromagnetic layer 104 and has a fixed magnetization direction, and a nonmagnetic layer 110 which is disposed between the first ferromagnetic layer 104 and the second ferromagnetic layer 112. Since the configuration of the spin-orbit-torque magnetization rotational element is the same as that of the spin-orbit-torque magnetization rotational element 1 described with reference to FIGS. 1 and 2, a detailed description thereof will be omitted.

<Second Ferromagnetic Layer>

In the spin-orbit-torque magnetoresistance effect element 101, the magnetization direction of the second ferromagnetic layer 112 is fixed to one direction and the magnetization direction of the first ferromagnetic layer 104 relatively changes. In the case of a coercive force differential type (pseudo spin valve type) MRAM, the coercive force of the second ferromagnetic layer 112 is set to be larger than the coercive force of the first ferromagnetic layer 104. In the case of an exchange bias type (spin valve type) MRAM, the magnetization direction of the second ferromagnetic layer 112 is fixed by exchange coupling with the antiferromagnetic layer.

Further, the spin-orbit-torque magnetoresistance effect element 101 is a TMR (Tunneling Magnetoresistance) element when the nonmagnetic layer 110 is formed of an insulation material and is a GMR (Giant Magnetoresistance) element when the nonmagnetic layer 110 is formed of a metal.

As a lamination structure of the spin-orbit-torque magnetoresistance effect element 101, a lamination structure of a known spin-orbit-torque magnetoresistance effect element can be employed. For example, each layer may include a plurality of layers or may include other layers such as an antiferromagnetic layer for fixing the magnetization direction of the second ferromagnetic layer 112. The second ferromagnetic layer 112 is called a fixed layer or a reference layer, and the first ferromagnetic layer 104 is called a free layer or a memory layer.

The second ferromagnetic layer 112 has a major axis along the Y direction. The direction of the magnetization 114 can be set to various directions, but, for example, as shown in FIG. 5, the direction may be parallel to the easy axis of magnetization of the first ferromagnetic layer 104 (a direction along the magnetization 108) or may be set along the Y direction.

A known material can be used in the second ferromagnetic layer 112 and the same material as that of the first ferromagnetic layer 104 can be used. Since the first ferromagnetic layer 104 is an in-plane magnetization film, the second ferromagnetic layer 112 is also preferably an in-plane magnetization film.

Further, an antiferromagnetic material such as IrMn or PtMn may be used as a material in contact with the second ferromagnetic layer 112 in order to further increase the coercive force of the second ferromagnetic layer 112 with respect to the first ferromagnetic layer 104. Furthermore, in order to prevent the leakage magnetic field of the second ferromagnetic layer 112 from affecting the first ferromagnetic layer 104, a synthetic ferromagnetic coupling structure may be adopted.

<Nonmagnetic Layer>

A known material can be used in the nonmagnetic layer 110. For example, when the nonmagnetic layer 110 is formed of an insulation material (in the case of a tunnel barrier layer), the material may be $Al_2O_3$, $SiO_2$, MgO, and $MgAl_2O_4$. In addition to these materials, materials in which a part of Al, Si, and Mg is substituted with Zn, Be, or the like can also be used. Among these, since MgO and $MgAl_2O_4$ are materials that can realize coherent tunneling, a spin can be injected efficiently. Further, when the nonmagnetic layer 110 is formed of a metal, Cu, Au, Ag, or the like can be used as that material. In addition, when the nonmagnetic layer 70 is formed of a semiconductor, Si, Ge, $CuInSe_2$, $CuGaSe_2$, $Cu(In, Ga)Se_2$, or the like can be used as that material.

Further, the spin-orbit-torque magnetoresistance effect element 101 may include other layers. For example, an underlayer may be provided on the surface of the first ferromagnetic layer 104 opposite to the nonmagnetic layer 110 or a cap layer may be provided on the surface of the second ferromagnetic layer 112 opposite to the nonmagnetic layer 110.

(Principle of Spin-Orbit-Torque Magnetoresistance Effect Element)

Next, a principle of the spin-orbit-torque magnetoresistance effect element 101 will be described.

FIG. 5 is a plan view of the spin-orbit-torque magnetoresistance effect element 101 including the second ferromagnetic layer 112 in which the magnetization 114 follows the magnetization 108. The magnetization 108 of the first ferromagnetic layer 104 is inclined with respect to both the X direction and the Y direction. In FIG. 5, the direction of the magnetization 108 is aligned parallel to the magnetization 114 of the second ferromagnetic layer 112. In this case, an electrical resistance between the first ferromagnetic layer 104 and the second ferromagnetic layer 112 is brought into a low resistance state.

FIG. 6 is a plan view of the spin-orbit-torque magnetoresistance effect element 101 in a state in which the magnetization 108 of the first ferromagnetic layer 104 is inverted to the opposite direction to the case of FIG. 5. As described in the principle of the spin-orbit-torque magnetization rotational element, when a spin is injected from the spin-orbit torque wiring layer 102 into the first ferromagnetic layer 104, the magnetization 108 rotates and is inverted. Thus, the direction of the magnetization 108 is opposite to that of the magnetization 114 of the second ferromagnetic layer 112 in a parallel direction (an anti-parallel state). In this case, the electrical resistance between the first ferromagnetic layer 104 and the second ferromagnetic layer 112 becomes a high resistance state. Thus, depending on whether the directions of the magnetization 108 and the magnetization 114 are parallel or antiparallel, the spin-orbit-torque magnetoresistance effect element 101 serves as a magnetic memory that stores 0/1 data corresponding to the state of electrical resistance between the first ferromagnetic layer 104 and the second ferromagnetic layer 112.

Furthermore, here, a case in which the magnetization 114 of the second ferromagnetic layer 112 is inclined with respect to the X direction and the Y direction will be described as an example. In this case, the magnetization 108 of the first ferromagnetic layer 104 and the magnetization 114 of the second ferromagnetic layer 112 become a completely parallel state or a completely antiparallel state. That is, the MR ratio of the spin-orbit-torque magnetoresistance effect element 101 can be increased. However, the magnetization 114 of the second ferromagnetic layer 112 may be set along the Y direction on the basis of the shape anisotropy of the second ferromagnetic layer 112. Also in this case, the Y direction element of the magnetization 108 of the first ferromagnetic layer 104 can become parallel or antiparallel with respect to the magnetization 114 of the second ferromagnetic layer 112 and can serve as a magnetic memory.

(Spin-Orbit-Torque Magnetoresistance Effect Element According to Second Embodiment)

Figure 7:
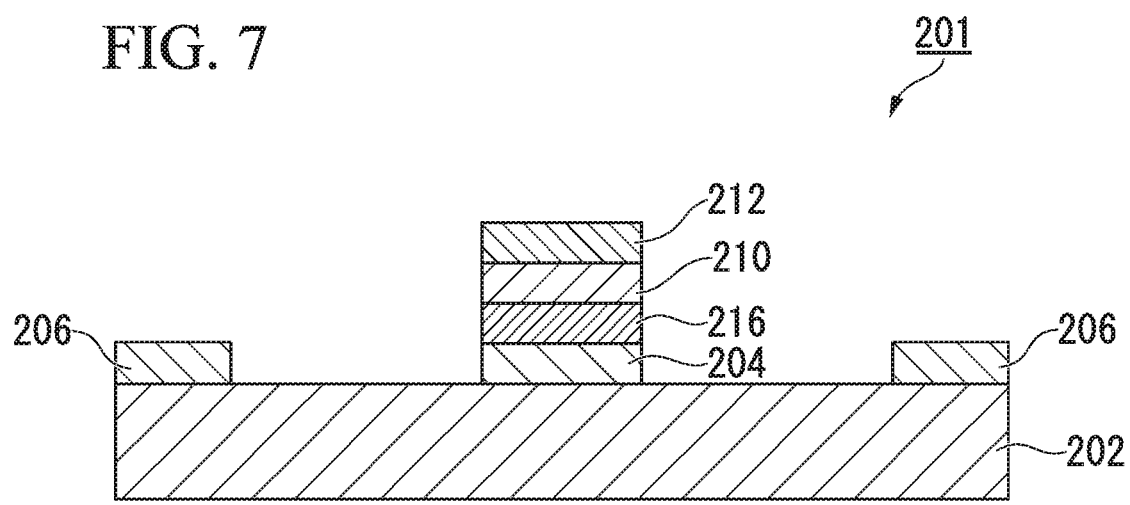
FIG. 7 is a cross-sectional view schematically showing a spin-orbit-torque magnetoresistance effect element according to an embodiment of the present disclosure.

FIG. 7 is a cross-sectional view schematically showing a spin-orbit-torque magnetoresistance effect element 201 according to a second embodiment of the present disclosure. In the spin-orbit-torque magnetoresistance effect element 201, a first ferromagnetic layer 204 may include a diffusion prevention layer 216. The diffusion prevention layer 216 may be provided on a surface at the side of the nonmagnetic layer 210 on the first ferromagnetic layer 204 or may be provided in any part of the first ferromagnetic layer 204 in the thickness direction. In the latter case, the first ferromagnetic layer has a three layer structure including a lower layer, a diffusion prevention layer, and an upper layer. Since the configuration is otherwise the same as that in the spin-orbit-torque magnetoresistance effect element 101 according to the first embodiment, a detailed description thereof will be omitted.

<Diffusion Prevention Layer>

As the material of the diffusion prevention layer 216, nonmagnetic heavy metal can be used. For example, when annealing is performed as in the case of realizing the first ferromagnetic layer 204 having a magnetization inclined with respect to both the X direction and the Y direction, element diffusion from the inside of the first ferromagnetic layer 204 to the second ferromagnetic layer 212 may occur and the magnetic properties may deteriorate. However, when the diffusion prevention layer 216 is disposed on the first ferromagnetic layer 204, it is possible to curtail element diffusion from the inside of the first ferromagnetic layer 204 to the second ferromagnetic layer 212 even when annealing is performed at a high temperature after the first ferromagnetic layer, and the second ferromagnetic layer, are formed. As a result, magnetic properties thereof do not deteriorate.

Further, the diffusion prevention layer 216 may include a nonmagnetic heavy metal. Since heavy metal elements hardly move even with annealing, it is thus possible to prevent element diffusion of the first ferromagnetic layer 204 and the second ferromagnetic layer 212 even when annealing is performed at a high temperature after forming the first ferromagnetic layer, and the second ferromagnetic layer, as a result, it is possible to prevent deterioration of magnetic properties of the first ferromagnetic layer 204 and the second ferromagnetic layer 212.

The diffusion prevention layer 216 has a thickness of twice or less the ionic radius of the constituting element. In the case of such a thickness, strictly, heavy metal elements are scattered in islands and a mixed layer of the upper layer or the lower layer, and the heavy metal element becomes the diffusion preventing layer.

(Spin-Orbit-Torque Magnetoresistance Effect Element According to Third Embodiment)

Figure 8:
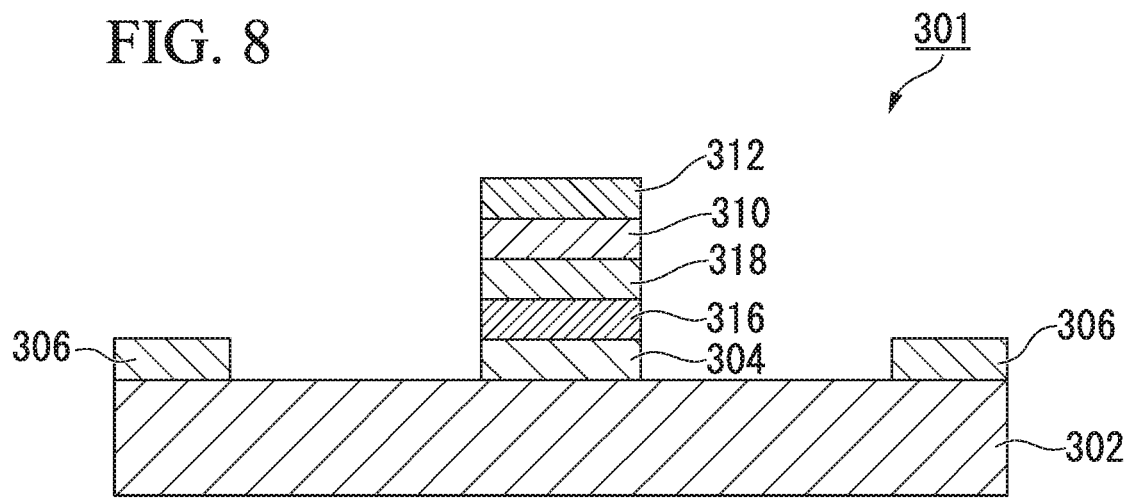
FIG. 8 is a cross-sectional view schematically showing a spin-orbit-torque magnetoresistance effect element according to an embodiment of the present disclosure.
Figure 9:
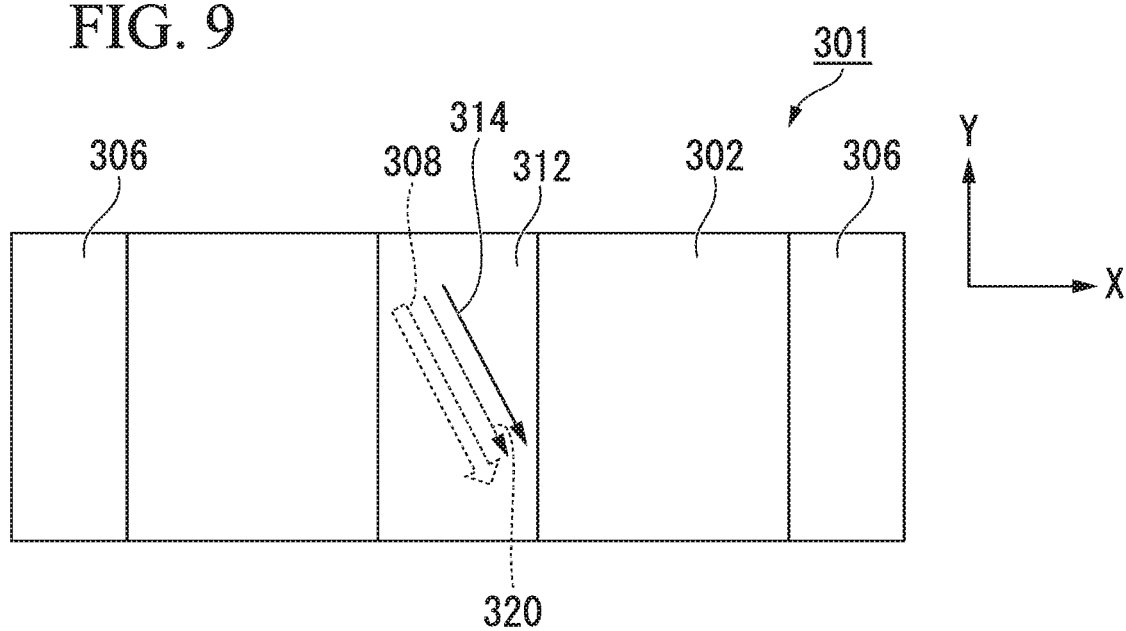
FIG. 9 is a plan view schematically showing the spin-orbit-torque magnetoresistance effect element of FIG. 8.

FIG. 8 is a cross-sectional view schematically showing a spin-orbit-torque magnetoresistance effect element 301 according to a third embodiment of the present disclosure and FIG. 9 is a plan view schematically showing the spin-orbit-torque magnetoresistance effect element 301 of FIG. 8. The spin-orbit-torque magnetoresistance effect element 301 includes a third ferromagnetic layer 318 which is disposed between a first ferromagnetic layer 304 and a nonmagnetic layer 310. Since the configuration is otherwise the same as that of the spin-orbit-torque magnetoresistance effect element 301 according to the second embodiment, a detailed description thereof will be omitted. Furthermore, FIG. 8 shows a configuration in which the first ferromagnetic layer 304 includes the diffusion prevention layer 316, but the diffusion prevention layer 316 may be omitted.

As the material of the third ferromagnetic layer 318, CoFeB, CoB, or FeB can be used. Further, the third ferromagnetic layer 318 includes a magnetization 320 aligned in a direction parallel to the magnetization 308 of the first ferromagnetic layer 304. When the third ferromagnetic layer 318 is disposed between the first ferromagnetic layer 304 and the nonmagnetic layer 310, the first ferromagnetic layer 304 and the third ferromagnetic layer 318 are magnetically coupled to each other to rotate as one magnetization. Thus, since the third ferromagnetic layer 318 is disposed, there is an effect that the magnetoresistance effect is improved.

(Magnetic Recording Array According to Fourth Embodiment)

Figure 10:
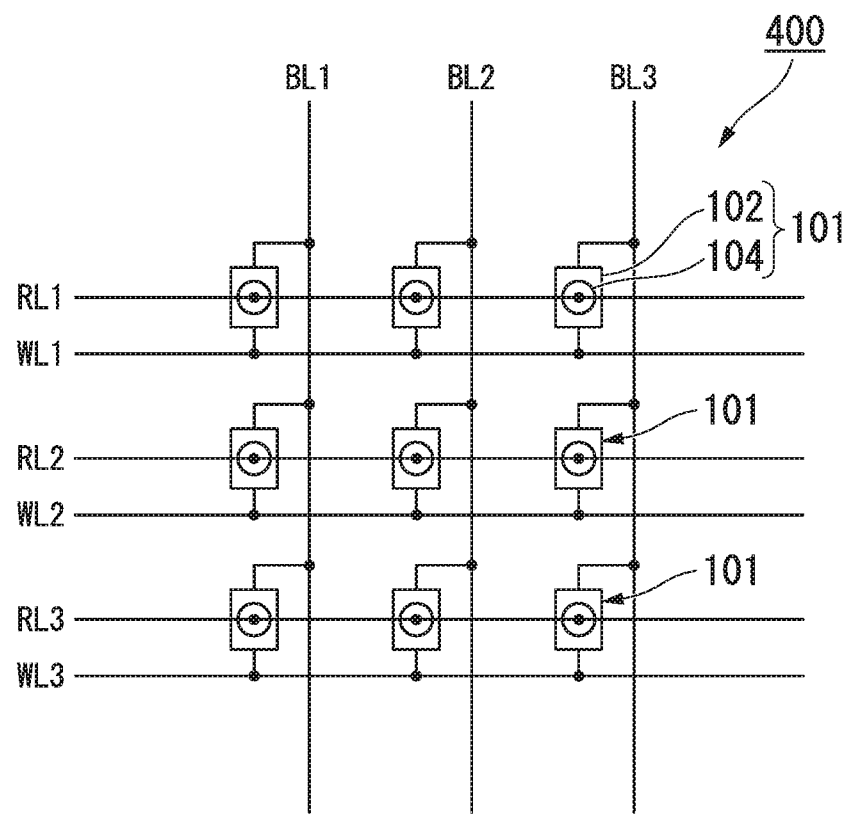
FIG. 10 is a plan view of a magnetic recording array according to a fourth embodiment.

FIG. 10 is a plan view of a magnetic recording array 400 according to a fourth embodiment. The magnetic recording array 400 shown in FIG. 10 has a configuration in which the spin-orbit-torque magnetoresistance effect element 101 has a 3×3 matrix arrangement. FIG. 10 is an example of a magnetic recording array and the type, the number, and the arrangement of the spin-orbit-torque magnetoresistance effect element 101 can be set arbitrarily. Further, a control unit may be present in all spin-orbit-torque magnetoresistance effect elements 101 or may be provided for each spin-orbit-torque magnetoresistance effect element 101.

One of word lines WL1 to WL3, one of bit lines BL1 to BL3, and one of lead lines RL1 to RL3 are respectively connected to a magnetic domain wall motion type magnetic recording element 100.

A writing operation is performed by allowing a pulse current to flow to the first ferromagnetic layer 104 of an arbitrary spin-orbit-torque magnetoresistance effect element 101 when selecting the word lines WL1 to 3 and the bit lines BL1 to 3 to which a current is applied. Further, a reading operation is performed by allowing a current to flow in the lamination direction of an arbitrary spin-orbit-torque magnetoresistance effect element 101 when selecting the read lines RL1 to 3 and the bit lines BL1 to 3 to which a current is applied. The word lines WL1 to 3, the bit lines BL1 to 3, and the read lines RL1 to 3 to which a current is applied can be selected by a transistor or the like. Since the spin-orbittorque magnetoresistance effect elements 101 record information with multiple values, it is possible to realize a high capacity magnetic recording array.

Although preferred embodiments of the present disclosure have been described in detail, the present disclosure is not limited to a particular embodiment and various modifications and changes can be made without departing from the spirit of the present disclosure described in the claims.

Figure 12:
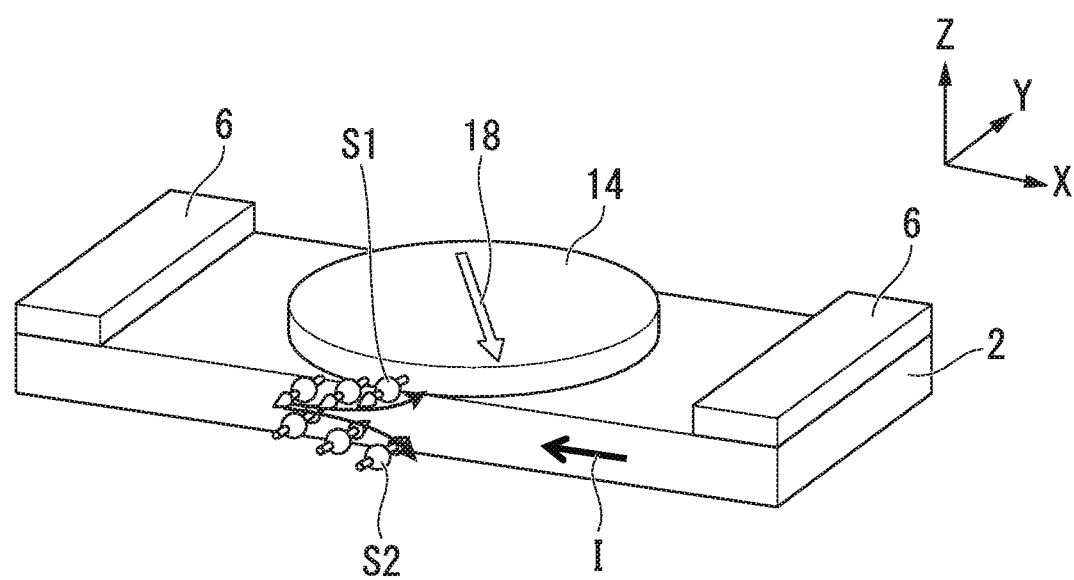
FIG. 12 is a perspective view schematically showing another example of the spin-orbit-torque magnetization rotational element.

Here, a spin-orbit-torque magnetization rotational element shown in FIG. 12 has a circular shape when the first ferromagnetic layer 14 is viewed from the z direction in a plan view. Since it has a circular shape in a plan view, that element does not have shape anisotropy.

However, the direction of the magnetization 18 of the first ferromagnetic layer 14 is inclined with respect to both the X direction and the Y direction and includes an X direction element and a Y direction element. Thus, since the magnetization 18 includes a Y direction element which is not orthogonal to the direction of the spin, it is possible to realize magnetization rotation while not applying an external magnetic field also in that configuration. Even when the easy direction of the magnetization 18 does not have shape anisotropy, the easy direction of the magnetization can be freely set by applying a magnetic field at the time of forming or annealing the film. An effect according to this configuration is not limited to a spin-orbit-torque magnetization rotational element and is also obtained in a spin-orbit-torque magnetoresistance effect element.

REFERENCE SIGNS LIST

1: Spin-orbit-torque magnetization rotational element
2, 102, 202, 302, 502: Spin torque wiring layer
4, 104, 204, 304, 504: First ferromagnetic layer
6, 106, 206, 306, 506: Electrode
108, 208, 308, 508: Easy axis of magnetization of first ferromagnetic layer
110, 210, 310: Nonmagnetic layer
112, 212, 312: Second ferromagnetic layer
114, 314: Magnetization of second ferromagnetic layer
216, 316: Diffusion prevention layer
318: Third ferromagnetic layer
320: Magnetization of third ferromagnetic layer
S1: First spin
S2: Second spin
I: Current
$J_s$: Pure spin current

The invention claimed is:

1. A spin-orbit-torque magnetization rotational element comprising:
a spin-orbit torque wiring layer which extends in an X direction and comprises nonmagnetic material; and
a first ferromagnetic layer which is laminated on the spin-orbit torque wiring layer,
wherein:
the first ferromagnetic layer has shape anisotropy and has a major axis in a Y direction orthogonal to the X direction on a plane in which the spin-orbit torque wiring layer extends, and
an easy axis of magnetization of the first ferromagnetic layer is inclined with respect to the X direction and the Y direction orthogonal to the X direction on the plane in which the spin-orbit torque wiring layer extends.

2. The spin-orbit-torque magnetization rotational element according to claim 1,
wherein the first ferromagnetic layer is an HoCo alloy, an SmFe alloy, an FePt alloy, a CoPt alloy, or a CoCrPt alloy.

3. A spin-orbit-torque magnetoresistance effect element comprising:
the spin-orbit-torque magnetization rotational element according to claim 1;
a second ferromagnetic layer which is disposed on a side of the first ferromagnetic layer opposite to a side with the spin-orbit torque wiring layer, a magnetization direction of the second ferromagnetic layer being fixed; and
a nonmagnetic layer which is disposed between the first ferromagnetic layer, and the second ferromagnetic layer.

4. A spin-orbit-torque magnetoresistance effect element comprising:
the spin-orbit-torque magnetization rotational element according to claim 2;
a second ferromagnetic layer which is disposed on a side of the first ferromagnetic layer opposite to a side with the spin-orbit torque wiring layer, a magnetization direction of the second ferromagnetic layer being fixed; and
a nonmagnetic layer which is disposed between the first ferromagnetic layer, and the second ferromagnetic layer.

5. The spin-orbit-torque magnetoresistance effect element according to claim 3, further comprising:
a third ferromagnetic layer which is disposed between the first ferromagnetic layer, and the nonmagnetic layer.

6. The spin-orbit-torque magnetoresistance effect element according to claim 4, further comprising:
a third ferromagnetic layer which is disposed between the first ferromagnetic layer, and the nonmagnetic layer.

7. The spin-orbit-torque magnetoresistance effect element according to claim 3,
wherein the first ferromagnetic layer includes a diffusion prevention layer on a surface on a side with the nonmagnetic layer on the first ferromagnetic layer.

8. The spin-orbit-torque magnetoresistance effect element according to claim 4,
wherein the first ferromagnetic layer includes a diffusion prevention layer on a surface on a side with the nonmagnetic layer on the first ferromagnetic layer.

9. The spin-orbit-torque magnetoresistance effect element according to claim 5,
wherein the first ferromagnetic layer includes a diffusion prevention layer on a surface on a side with the nonmagnetic layer on the first ferromagnetic layer.

10. The spin-orbit-torque magnetoresistance effect element according to claim 6,
wherein the first ferromagnetic layer includes a diffusion prevention layer on a surface on a side with the nonmagnetic layer on the first ferromagnetic layer.

11. The spin-orbit-torque magnetoresistance effect element according to claim 7,
wherein the diffusion prevention layer contains a nonmagnetic heavy metal.

12. The spin-orbit-torque magnetoresistance effect element according to claim 8,
wherein the diffusion prevention layer contains a nonmagnetic heavy metal.

13. The spin-orbit-torque magnetoresistance effect element according to claim 9,
wherein the diffusion prevention layer contains a nonmagnetic heavy metal.

14. The spin-orbit-torque magnetoresistance effect element according to claim 10,
wherein the diffusion prevention layer contains a nonmagnetic heavy metal.

15. The spin-orbit-torque magnetoresistance effect element according to claim 7,
wherein the diffusion prevention layer has a thickness of twice or less an ionic radius of an element constituting the diffusion prevention layer.

16. A method of manufacturing the spin-orbit-torque magnetization rotational element according to claim 1, comprising:
forming the spin-orbit torque wiring layer with the nonmagnetic material; and
forming at least the first ferromagnetic layer on the spin-orbit torque wiring layer while applying a magnetic field in a direction including the X direction.

17. The method of manufacturing the spin-orbit-torque magnetization rotational element according to claim 16, further comprising:
annealing the first ferromagnetic layer while applying a magnetic field thereto in directions including the X direction after forming at least the first ferromagnetic layer.

18. A method of manufacturing the spin-orbit-torque magnetization rotational element according to claim 1, comprising:
forming the spin-orbit torque wiring layer with the nonmagnetic material; and
annealing the first ferromagnetic layer on the spin-orbit torque wiring layer while applying a magnetic field in a direction including the X direction after forming at least the first ferromagnetic layer.

19. The spin-orbit-torque magnetoresistance effect element according to claim 7,
wherein the diffusion prevention layer has a thickness of twice or less an ionic radius of an element constituting the diffusion prevention layer.

20. A spin-orbit-torque magnetoresistance effect element comprising:
a spin-orbit-torque magnetization rotational element comprising:
a spin-orbit torque wiring layer which extends in an X direction; and
a first ferromagnetic layer which is laminated on the spin-orbit torque wiring layer;
a second ferromagnetic layer which is disposed on a side of the first ferromagnetic layer opposite to a side with the spin-orbit torque wiring layer, a magnetization direction of the second ferromagnetic layer being fixed;
a nonmagnetic layer which is disposed between the first ferromagnetic layer, and the second ferromagnetic layer; and
a third ferromagnetic layer which is disposed between the first ferromagnetic layer and the nonmagnetic layer,
wherein:
the first ferromagnetic layer has shape anisotropy and has a major axis in a Y direction orthogonal to the X direction on a plane in which the spin-orbit torque wiring layer extends,
an easy axis of magnetization of the first ferromagnetic layer is inclined with respect to the X direction and the Y direction orthogonal to the X direction on the plane in which the spin-orbit torque wiring layer extends, and
the first ferromagnetic layer includes a diffusion prevention layer on a surface on a side with the nonmagnetic layer on the first ferromagnetic layer.

* * * * *